United States Patent [19]

Staley, III

[11] Patent Number: 5,249,143
[45] Date of Patent: Sep. 28, 1993

[54] COUPLING RADIANT ENERGY/ELECTRIC CURRENT TRANSDUCERS TO PROCESSORS

[75] Inventor: John R. Staley, III, Corona, Calif.
[73] Assignee: Newport Corporation, Irvine, Calif.
[21] Appl. No.: 703,299
[22] Filed: May 20, 1991
[51] Int. Cl.$^5$ .................. G01D 18/00; G06F 3/00
[52] U.S. Cl. ........................................ 364/571.01
[58] Field of Search ............. 364/571.01, 571.02, 364/571.04, 483, 571.07

[56] References Cited

U.S. PATENT DOCUMENTS

| | | | |
|---|---|---|---|
| 4,423,408 | 12/1983 | Place | 341/120 |
| 4,845,649 | 7/1989 | Eckardt et al. | 364/571.01 |
| 4,858,615 | 8/1989 | Meinema | 364/571.01 |
| 4,870,863 | 10/1989 | Duncan et al. | 364/571.04 |
| 5,089,979 | 2/1992 | McEachern et al. | 364/571.07 |

OTHER PUBLICATIONS

Motorola Microprocesor Date Handbook, vol. II (1988).
Hitachi 8-Bit Single-Chip Microcomputer Data Book (Feb. 1988).
Xicor Data Book (May 1987).

Primary Examiner—Thomas G. Black
Assistant Examiner—Michael Zanelli
Attorney, Agent, or Firm—Benoit Law Corporation

[57] ABSTRACT

In methods and apparatus for operatively coupling a radiant energy/electric current transducer to an electric current processor, a removable coupling module is provided for insertion between that processor and that transducer. A memory integrated circuit is provided in that coupling module. Information about the transducer relevant to operation of the processor is stored in that memory integrated circuit. A processor connector plug is on the removable coupling module for the memory integrated circuit. The coupling module is separable from the processor at that processor connector plug. A transducer connector plug is on the removable coupling module. The transducer is separable from the coupling module at that transducer connector plug, wherein the transducer is separable from the coupling module and that coupling module is separable from the processor. During operation of the transducer, the stored information is obtained with the processor from the memory integrated circuit in the coupling module, and the processor is operated pursuant to that obtained information to process electric current for the transducer.

18 Claims, 4 Drawing Sheets

COUPLING RADIANT ENERGY/ELECTRIC CURRENT TRANSDUCERS TO PROCESSORS

FIELD OF THE INVENTION

The subject invention relates to methods and apparatus for operatively coupling radiant energy/electric current transducers to electric current processors, including methods and apparatus for coupling photodetectors and other radiant energy sensors to output signal processors and optical power meters, and methods and apparatus for coupling electrically energized radiant energy emitters to processors for controlling their energization from electric power sources.

BACKGROUND OF THE INVENTION

Taking the example of optical power meters, it is well known that microprocessors are used in such apparatus for adapting the power meter readout to the light input-to-electric signal output of the photodetector. A memory integrated circuit in such apparatus is pre-programmed with the calibration information on detectors used with that apparatus. In practice, this limits the power meter to use with one detector or with a narrow range of functionally equivalent detectors.

For increased versatility in this respect, another approach has been to combine the programmable memory integrated circuit in one unit with the detector to which the calibration information with which that memory integrated circuit has been programmed pertains. This liberated the power meter for use with detectors of various characteristics, but, in turn, limited the photodetector to use with the memory integrated circuit combined therewith.

This left a need for increased versatility in the optical power meter field, especially now that the fiber optics networks have become widespread and require enormous optical power measurement procedures at an increasing number of job sites, quite in addition to the increasingly demanding optical power measurements in laboratories and otherwise in research, planning, development, and performance evaluation and verification.

Similar needs can be discerned with other than optical radiant sensors which have specific radiant energy-to-electric signal response characteristics, and even with light emitting diodes, lasers or other electrically energized radiant energy emitters having an output controllable by input energization according to specific radiant output-to-electrical energization characteristics.

SUMMARY OF THE INVENTION

It is a general object of the invention to overcome the disadvantages and to meet the needs expressed or implicit in the background set forth above, or in other parts hereof.

It is a germane object of this invention to provide improved methods and apparatus for operatively coupling a radiant energy/electric current transducer to an electric current processor.

It is a related object of the invention to provide improved methods and apparatus for operatively coupling a radiant energy sensor effectively to a processor and sensor signal readout or display unit.

It is also an object of the invention to provide improved methods and apparatus for electrically energizing a radiant energy emitter from a power source with the aid of a processor.

It is also an object of this invention to provide modules with memory integrated circuits for use with various radiant energy sensors and emitters and related processors.

Other objects of the invention will become apparent in the further course of this disclosure.

The invention resides in a method of operatively coupling a radiant energy/electric current transducer to an electric current processor, comprising in combination the steps of providing a removable coupling module for insertion between that processor and that transducer, providing a memory integrated circuit in that coupling module, providing that removable coupling module with a transducer connector plug accessible externally of that coupling module for connection of the transducer to that coupling module, such transducer being separable from that coupling module at the transducer connector plug, providing the removable coupling module with a processor connector plug for connection of the memory integrated circuit to the processor, the coupling module being separable from the processor at that processor connector plug, storing in that memory integrated circuit information about the transducer relevant to operation of the processor, plugging the transducer into the transducer connector plug of the removable coupling module, plugging that removable coupling module into the processor at the processor connector plug, obtaining the stored information with that processor through the processor connector plug from the memory integrated circuit in the coupling module, operating that processor pursuant to that obtained information to process electric current coming from or going to the transducer through the connector plugs.

The invention resides also in apparatus for operatively coupling a radiant energy/electric current transducer to an electric energy processor, comprising, in combination, a removable coupling module between that processor and that transducer, a memory integrated circuit in that coupling module adapted to store information about the transducer relevant to operation of the processor, a processor connector plug on that removable coupling module for the memory integrated circuit, that coupling module being separable from the processor at that processor connector plug, a transducer connector plug on the removable coupling module, such transducer being separable from that coupling module at the transducer connector plug, wherein the transducer is separable from the coupling module and that coupling module is separable from the processor, and means in that processor and the coupling module for obtaining the stored information from the memory integrated circuit in that coupling module and for operating that processor pursuant to that obtained information to process electric current coming from or going to the transducer through the connector plugs.

From a related object thereof, the invention resides in apparatus for operatively coupling a radiant energy/electric current transducer to an electric energy processor for processing electric current coming from or going to the transducer with the aid of information about that transducer, comprising, in combination, a removable coupling module adapted for insertion and electric current conduction between that processor and that transducer, and a memory integrated circuit in that coupling module adapted to store the information about that transducer for the processor a processor connector plug on that removable coupling module for connection of the memory integrated circuit to the processor, that coupling module being separable from the processor at the processor connector plug, a transducer connector plug on the removable coupling module, the transducer being separable from the coupling module at that transducer connector plug, wherein the transducer is separable from the coupling module, that said coupling module is separable from the processor.

BRIEF DESCRIPTION OF THE DRAWINGS

The subject invention and its various aspects and objects will become more readily apparent from the following detailed description of preferred embodiments thereof, illustrated by way of example in the accompanying drawings, in which like reference numerals designate like or equivalent parts, and in which.

DESCRIPTION OF PREFERRED EMBODIMENTS

The drawings show embodiments of the invention for operatively coupling a radiant energy/electric current transducer 10 to an electric energy processor 12. By way of example, the transducer 10 may be a photodiode or other luminous or radiant energy sensor for providing an electric signal in response to light or other sensed radiant energy. Alternatively, the transducer 10 may be a light-emitting diode or other luminous or radiant energy emitter electrically energized from the processor 12. Accordingly, the generic expression "radiant energy/electric current transducer" is herein employed for the component 10.

The illustrated embodiments of the invention provide a removable coupling module 13 between the processor 12 and the transducer 10. A memory integrated circuit 14 is provided in that coupling module 12 and information about the transducer 10 relevant to operation of the processor 12 is stored in that memory integrated circuit.

That information is obtained with the processor 12 from the memory integrated circuit 14 in the coupling module 13, and the processor 12 is operated pursuant to that obtained information.

In the illustrated embodiments of the invention, the module 13 is separate not only from the processor 12, but also from the transducer 10. The module 13 may come with the transducer 10, but may serve other transducers with similar characteristics and with similar needs from the processor 12.

By way of example, if the transducer 10 is a photodiode or other radiant energy sensor providing an electric signal in response to sensed radiant energy, then the information just mentioned may be a radiant energy-to-electric signal response characteristic of that sensor and is stored in the memory integrated circuit 14 in the coupling module 13.

Information of that radiant energy-to-electric signal response characteristic is obtained with the processor 12 from the memory integrated circuit 14 in the coupling module 13, and that processor is operated pursuant to that obtained information of the radiant energy-to-electric signal response characteristic.

In practice, the previously separate transducer 10, module 13 and processor 12 are interconnected for an operation of the transducer relative to the processor 12.

If the transducer 10 is a photodiode or luminous energy sensor providing an electric signal in response to sensed luminous energy, then the information in question may be a luminous energy-to-electric signal value response characteristic of that sensor and is stored in the memory integrated circuit 14 in the coupling module 13. Information of that luminous energy-to-electric signal value response characteristic is obtained with the processor 12 from the memory integrated circuit 14 in the coupling module 13 and electric signal values produced by that sensor 10 in response to corresponding luminous energy values 16 are applied through the interconnected coupling module 13 to the processor 12 connected thereto.

That processor then determines the luminous energy values from the applied electric signal values with the aid of the information of the luminous energy-to-electric signal value response characteristic obtained from the memory integrated circuit 14 in the coupling module 13.

The processor 12 may drive an electric power meter 18 or may be part of the electric power meter which is then driven by the processor with the signals of the luminous or other radiant energy values determined with the interconnected components 10, 12 and 13 and the information stored in and derived from the memory integrated circuit 14.

By way of example, the information may be a radiant energy-to-electric signal value response characteristic of the sensor 10 and is stored in the memory integrated circuit 14 in the coupling module 13. Information of that radiant energy-to-electric signal value response characteristic is obtained with the processor 12 from the memory integrated circuit 14 in the coupling module 13. Electric signal values produced by the sensor 10 in response to corresponding radiant energy values 16 are applied through the coupling module 13 to the processor 12 which determines the radiant energy values from the applied electric signal values with the aid of the information of the radiant energy-to-electric signal value response characteristic obtained from the memory integrated circuit 14 in the coupling module 13, for display of these radiant energy values by the power meter 18.

Figure 1:
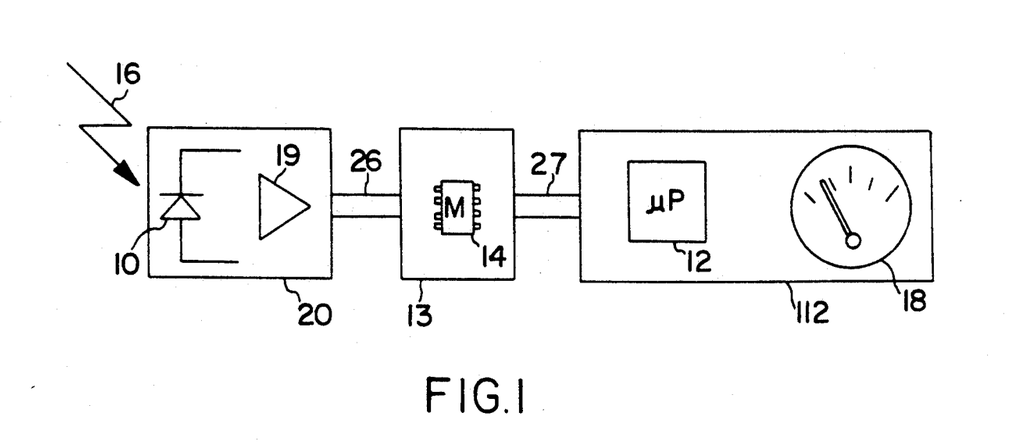
FIG. 1 is a block diagram of a radiant energy sensor, processor and readout combination with memory integrated circuit in a coupling module according to an embodiment of the invention.
Figure 2:
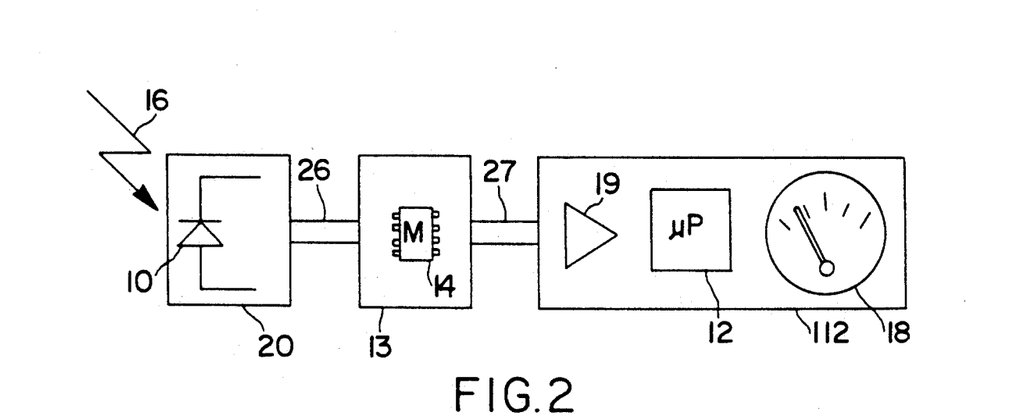
FIG. 2 is a block diagram of a modification of the apparatus of FIG. 1 according to a further embodiment of the invention.

According to FIG. 1, the output signal of the sensor may be amplified by an amplifier 19 which may, for instance, be incorporated in the input module 20 which also houses the transducer 10. Additionally or alternatively, the or an amplifier 19 may be incorporated in the processor, as shown in FIG. 2.

Figure 8:
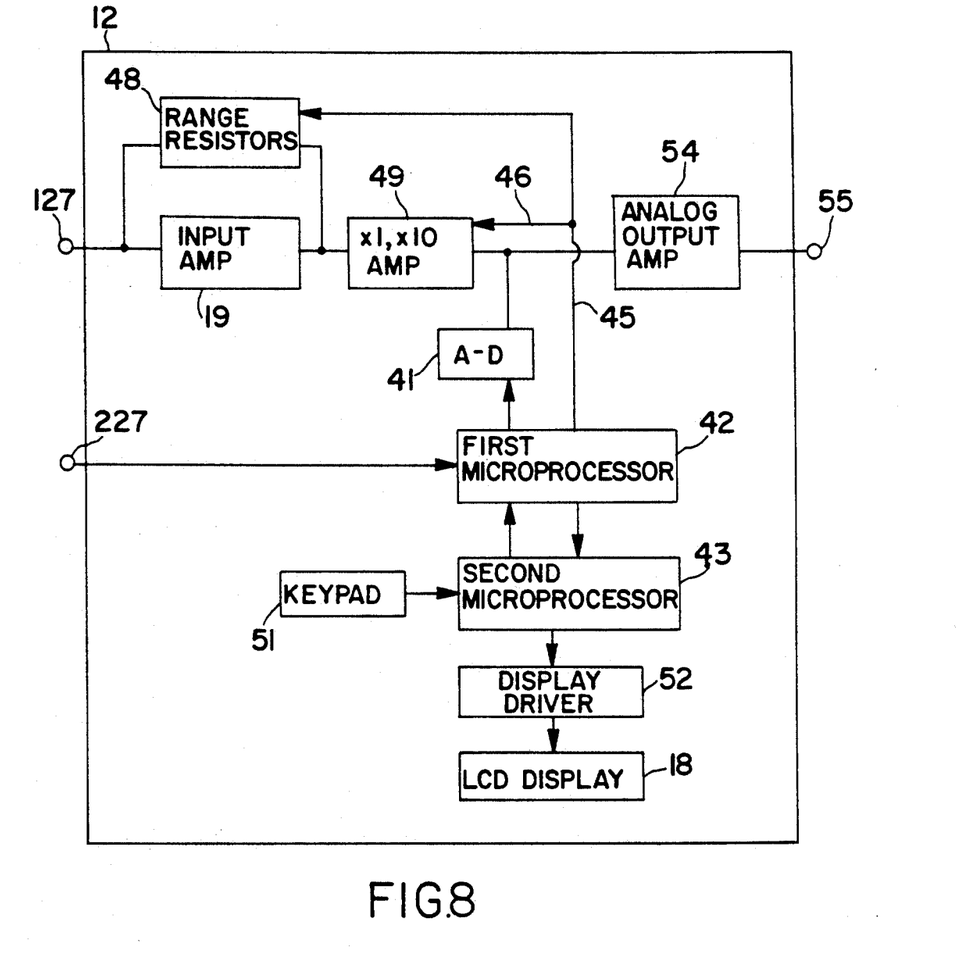
FIG. 8 is a block diagram of a processor with readout unit according to an embodiment of the invention useable in the apparatus of FIGS. 1 and 2, for instance.

As will become further apparent in connection with FIG. 8, the processor 12 preferably is a microchip. In that case, that microchip and the readout or meter 18 may be housed in an enclosure or unit 112, but that unit may herein be considered as a microprocessor control and display unit or simply as a "microprocessor."

Figure 3:
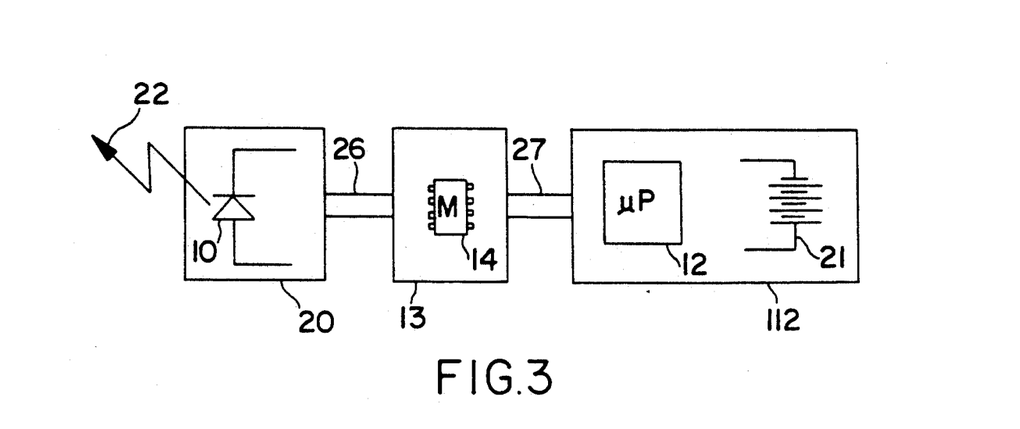
FIG. 3 is a block diagram of a radiant energy emitter, power source therefore, and processor with memory integrated circuit in a coupling module according to another embodiment of the invention.

As already mentioned above, the transducer 10 may be a light-emitting diode or other radiant energy emitter electrically energized from the processor 12, as shown, for instance, in FIG. 3. In this respect, the processor 12 is connected to or may include an electric battery or other electric power source 21 for energizing the transducer 10 to emit light or other radiant energy 22.

In that case, the information to be stored and used is an electric energization-to-radiant energy conversion characteristic of the radiant energy emitter 10 and is stored in the memory integrated circuit 14 in the coupling module 13. That information of said electric energization-to-radiant energy conversion characteristic of the radiant energy emitter 10 is also obtained with the processor 12 from the memory integrated circuit 14 in the coupling module 13, and the radiant energy emitter 10 is electrically energized with the processor 12 pursuant to that obtained information of the electric energization-to-radiant energy conversion characteristic. The radiant energy emitter 10 is thus correctly energized from the battery or other power source 21 to emit the desired light output or other radiant energy 22, as illustrated, for instance, in FIG. 3. As in FIG. 1, an amplifier may also be incorporated in the module 20 of FIG. 3. An amplifier in such a case would serve to drive the emitter in FIG. 3, and may in effect be considered part of that emitter 10.

Two or more modules 13 may be provided for two or more transducers 10 or for two or more processors 12, for that matter. For instance, if there is a second electric current/radiant energy transducer, such as the transducer 10 shown in FIG. 2 as distinguished from the transducer 10 shown in FIG. 1, then an embodiment of the invention provides a second removable coupling module for that second transducer or between the processor 12 and that second transducer, such as the coupling module 13 shown in FIG. 2 as distinguished from the coupling module 13 shown in FIG. 1.

That embodiment then also provides a second memory integrated circuit in the second coupling module, such as the integrated circuit 14 shown in FIG. 2 as distinguished from the integrated circuit 14 shown in FIG. 1, and stores in that second memory integrated circuit second information about the second transducer relevant to operation of the processor 12. That embodiment alternatively couples the second transducer through the second coupling module to the processor, obtaining the second information with the processor 12 from that second memory integrated circuit in that second coupling module, and operates that processor pursuant to that obtained second information.

Figure 4:
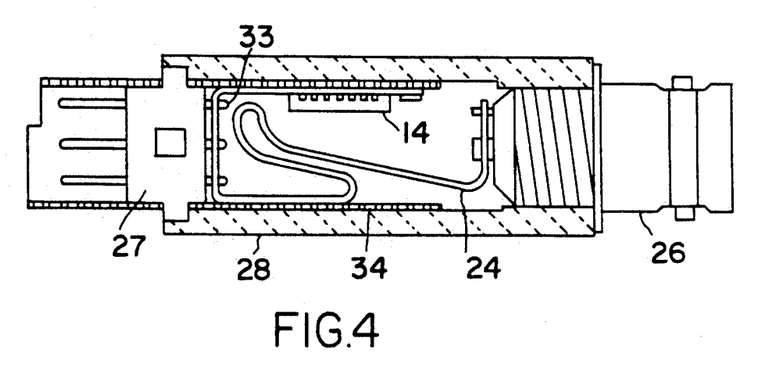
FIG. 4 is a longitudinal section of a coupling module with memory integrated circuit pursuant to an embodiment of the invention.
Figure 5:
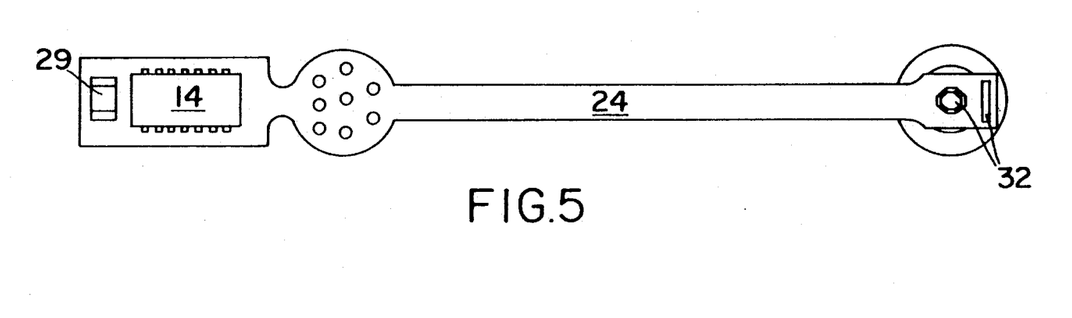
FIG. 5 is a top view of a flexible circuit board with memory integrated circuit and connectors useable in the coupling module of FIG. 4.
Figure 6:
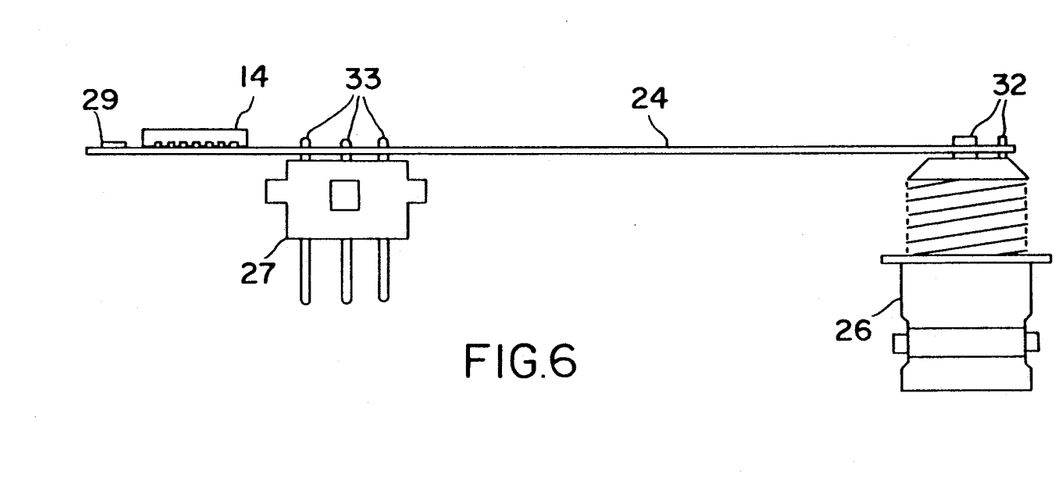
FIG. 6 is a side view of the device shown in FIG. 5.

As shown in FIGS. 4 to 6, the memory integrated circuit 14 may be provided on a circuit board 24, which may be a flexible substrate. That circuit board 24 and the memory integrated circuit 14 may be provided with a first connector plug 26 for connection to the transducer 10, including the output of the amplifier 19 if provided in the transducer module 20 as shown in FIG. 1.

The currently disclosed embodiment of the invention also provides the circuit board and the memory integrated circuit with a second connector plug 27 for connection to the processor 12. That circuit board 24 with the memory integrated circuit 14 and the first and second connector plug 26 and 27 may be incorporated in the coupling module 14. A tubular coupling module housing 28 may be provided for that purpose.

Figure 7:
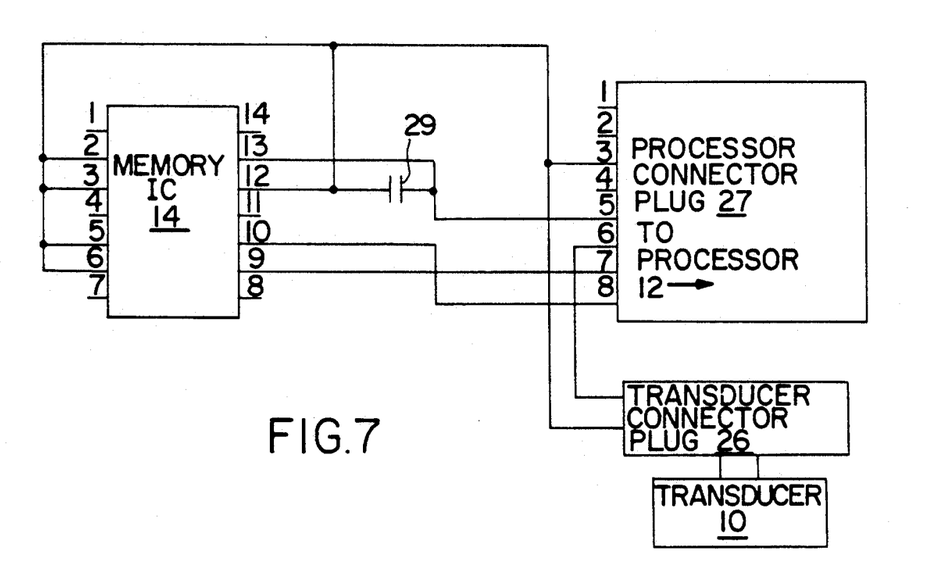
FIG. 7 is a schematic of the circuit module of FIGS. 1 to 6 according to an embodiment of the invention.

A block and circuit diagram, including the memory integrated circuit 14, the first and second connector plugs 26 and 27 and a filter capacitor 29, is shown by way of example in FIG. 7. A procedure for manufacturing the coupling module 13 may include the following steps:

1. Solder capacitor 29 and memory integrated circuit 14 to flex circuit board 24 as shown in FIGS. 5 to 7.
2. Solder connector plug 26 on far side of flex circuit. Cut connector leads 32 close to the circuit board.
3. Push the flexible circuit board 24 through the housing 28. Screw the connector plug 26 into end of housing as shown in FIG. 4. May use epoxy adhesive on the threads of connector plug 26.
4. Solder the shorter leads 33 of a mini connector plug 27 onto portion of the pushed-through flexible circuit board projecting from the housing 28.
5. Place a metal sleeve 34 (2 pieces) over the mini connector plug 27 using a small amount of epoxy adhesive over sleeve and slide sleeve with connector plug into housing 28, thereby folding the flexible circuit board 24 as shown in FIG. 4. Clean off excess epoxy. Voilà.

Information about the transducer 10 relevant to operation of the microprocessor 12 may be provided in a number of ways which may conventional as such. First, transducer parameters may be determined by measuring electric output signal as a function of radiant energy or light input 16 in the case of a radiant energy sensor or optical power meter (FIGS. 1 and 2), or by measuring radiant energy emission 22 as a function of electrical energization in the case of an electrically energized radiant energy emitter.

By way of illustration, let the transducer 10 be a photodetector, and measure detector response in ampere per watt (A/W) for each light input wavelength ($\lambda$) of interest, in nanometers (nm). Then codify each decimal response in the hexadecimal chip language of the memory integrated circuit 14.

The resulting computer printout typically will stretch over several pages. However, the following TABLE I picks certain representative values from an actual calibration test:

TABLE I

| $\lambda$nm | A/W |
|---|---|
| 800 | 0.2673983 |
| 850 | 0.3200041 |
| . | . |
| . | . |
| 1150 | 0.632045 |
| . | . |
| 1450 | 0.8743185 |
| . | . |
| 1800 | 0.1184511 |

The decimal values are encoded in hexadecimal values which are stored in the memory integrated circuit 14 in the coupling module 13. By way of example, the memory integrated circuit 14 may be a XICOR Electrically Erasable PROM, Type X24C041, as described in the *XICOR DATA BOOK*, p.p. 2-51 to 2-59, May 1987.

The coupling module 13 with programmed memory integrated circuit 14 may then be used with the photodetector for which the calibration according to Table I was effected and with other photodetectors 10 having that light input, or luminous energy-to-electric signal value response characteristic.

The photodetector 10 is plugged into the first connector plug 26 of the programmed coupling module and that coupling module 13 is plugged into the processor 12 at its second connector plug 27.

In operation, the processor 12 obtains from the programmed memory integrated circuit 14 in that plugged-in coupling module the information on the luminous energy-to-electric signal value response characteristic of the plugged-in photodetector 10.

By way of example, a block diagram of a processor 12 with light meter output or readout 18 is shown in FIG. 8.

In the illustrated example, the controller or processor 12 measures a signal from a photodetector 10 and modifies the result mathematically using an appropriate numerical value obtained from the E$^2$PROM or other memory 14 housed in the module 13. The modified result is subsequently displayed, such as at 18, with or without any additional mathematical manipulation.

The input of the processor 12, which connects to the output 27 of the module 13, is symbolically shown at 127 in FIG. 8. As optical radiation is incident on the photodetector, that photodetector 10 generates a signal which passes through the module 13 and via input terminal 127 to the input and amplifier 19 of the processor 12. That component 19 may be an inverting, low noise, two stage, chopper stabilized transimpedance amplifier that provides signal gain while simultaneously supplying any necessary isolation between the input signal and an A-D converter 41 which digitizes the conditioned analog input signal, providing information in a form usable by the two microprocessors 42 and 43. The input amplifier 19 has a first stage, providing gains of 20dB, 40dB, and 60dB, and a second stage providing gains of 0dB and 10dB. When instructed to do so by the first microprocessor 42, the A-D converter digitizes the conditioned input signal and provides the result in a form usable by that first microprocessor 42.

When the first microprocessor 42 receives a value from the A-D converter 41, it first determines whether the value is too high or low for the given amplifier gains. If the value is outside the acceptable range, the first microprocessor 42 sends control signals, such as via lines 45 and 46 to increase or decrease the gain of each of the input amplifier stages, such as by actuation of range resistors 48 and amplifier gain control 49. Once an acceptable signal value has been received from the A-D converter 41, the first microprocessor 42 divides this signal level by the appropriate numerical value downloaded from the E$^2$PROM or other memory chip 14 of a module 13. These numerical values are read out from the E$^2$PROM or other memory chip 14 via processor terminal 227, when the controller is first turned on. The particular numerical value to be used (out of all those down-loaded) may be established by the operator through the keypad 51. The resulting modified numerical result is sent to the second microprocessor 43.

That second microprocessor 43 receives the numerical result from the first microprocessor 42 and sends it to the display 18 via a display driver 52. When instructed to do so through the keypad, the second microprocessor will perform additional mathematical manipulations of the value received from the first microprocessor before sending the result out to the display. It is through these secondary mathematical that the controller executes such features as background information and unit conversions such as dBm.

In the illustrated example, an analog version of the displayed or calculated readout may be obtained from an analog amplifier 54 and output terminal 55.

By way of example, the second microprocessor 43 may be of the type Motorola MC68HC705C8, as shown, for instance, in the Motorola *MICROPROCESSOR DATA* handbook, Vol. II (1988) and 34 the first microprocessor 42 may be of the type Hitachi HD73705VO or type HD63705VO, as shown, for instance, in the *HITACHI 8-BIT SINGLE-CHIP MICROCOMPUTER DATA BOOK* (Feb. 1988), pp. 950 et seq.

The subject extensive disclosure will render apparent or suggest to those skilled in the art various modifications and variations within the spirit and scope of the subject invention and equivalents thereof.

I claim:

1. Apparatus for operatively coupling a radiant energy/electric current transducer to an electric energy processor for processing electric current coming from or going to the transducer with the aid of information about said transducer, comprising in combination:

a removable coupling module adapted for insertion and electric current conduction between said processor and said transducer;

a memory integrated circuit in said coupling module adapted to store said information about said transducer relevant to operation of said processor;

a processor connector plug on said removable coupling module for connection of said memory integrated circuit to said processor, said coupling module separable from said processor at said processor connector plug;

a transducer connector plug on said removable coupling module, said transducer separable from said coupling module at said transducer connector plug, wherein said transducer is separable from said coupling module, and said coupling module is separable from said processor.

2. Apparatus as in claim 1, wherein:

said transducer is a radiant energy sensor providing an electric signal as said electric current in response to sensed radiant energy; and said memory integrated circuit in said coupling module is adapted to store information on a radiant energy-to-electric signal response characteristic of said sensor for operation of said processor.

3. Apparatus as in claim 1, wherein:

said transducer is a luminous energy sensor providing an electric signal as said electric current in response to sensed luminous energy; and said memory integrated circuit in said coupling module is adapted to store information on a luminous energy-to-electric signal value response characteristic of said sensor for operation of said processor.

4. Apparatus as in claim 1 including:

a flexible circuit board in said removable coupling module for said memory integrated circuit and said transducer and processor connectors.

5. Apparatus for operatively coupling a radiant energy/electric current transducer to an electric energy processor, comprising in combination:
- a removable coupling module between said processor and said transducer;
- a memory integrated circuit in said coupling module adapted to store information about said transducer relevant to operation of said processor;
- a processor connector plug on said removable coupling module for connection of said memory integrated circuit to said processor, said coupling module separable from the processor at said processor connector plug;
- a transducer connector plug on said removable coupling module, said transducer separable from said coupling module at said transducer connector plug, wherein said transducer is separable from said coupling module and said and said coupling module is separable from said processor; and
- means in said processor and said coupling module for obtaining said information from said memory integrated circuit in said coupling module and for operating said processor pursuant to said obtained information to process electric current coming from or going to said transducer through said connector plugs.

6. Apparatus as in claim 5, wherein:
- said transducer is a radiant energy sensor providing an electric signal as said electric current in response to sensed radiant energy;
- said memory integrated circuit in said coupling module is adapted to store information on a radiant energy-to-electric signal response characteristic of said sensor; and
- said means in said processor include means for obtaining said information on said radiant energy-to-electric signal response characteristic from said memory integrated circuit in said coupling module and for operating said processor pursuant to said obtained information of said radiant energy-to-electric signal response characteristic to process said electric signal.

7. Apparatus as in claim 5, wherein:
- said transducer is a luminous energy sensor providing an electric signal as said electric current in response to sensed luminous energy;
- said memory integrated circuit in said coupling module is adapted to store information on a luminous energy-to-electric signal value response characteristic of said sensor; and
- said means in said processor include means for obtaining said information on said luminous energy-to-electric signal value response characteristic from said memory integrated circuit in said coupling module and for operating said processor pursuant to said obtained information of said luminous energy-to-electric signal value response characteristic to process said electric signal.

8. Apparatus as in claim 5, wherein:
- said transducer is a radiant energy sensor providing an electric signal as said electric current in response to sensed radiant energy;
- said processor is part of an electric power meter;
- said memory integrated circuit in said coupling module is adapted to store information on a radiant energy-to-electric signal value response characteristic of said sensor; and
- said means in said processor include means for obtaining said information on said radiant energy-to-electric signal value response characteristic from said memory integrated circuit in said coupling module and for operating said processor pursuant to said obtained information of said radiant energy-to-electric signal value response characteristic for a display of said radiant energy values by said power meter.

9. Apparatus as in claim 5, wherein:
- said transducer is a radiant energy emitter electrically energized from said processor;
- said memory integrated circuit in said coupling module is adapted to store information on an electric energization-to-radiant energy conversion characteristic of said radiant energy emitter; and
- said means in said processor include means for obtaining said information on said electric energization-to-radiant energy conversion characteristic of said radiant energy emitter from said memory integrated circuit in said coupling module and for electrically energizing said radiant energy emitter with said processor pursuant to said obtained information of said electric energization-to-radiant energy conversion characteristic.

10. Apparatus as in claim 5, including:
- a flexible circuit board in said removable coupling module for said memory integrated circuit and said transducer and processor connectors.

11. A method of operatively coupling a radiant energy/electric current transducer to an electric current processor, comprising in combination the steps of:
- providing a removable coupling module for insertion between said processor and said transducer;
- providing a memory integrated circuit in said coupling module;
- providing said removable coupling module with a transducer connector plug accessible externally of said coupling module for connection of said transducer to said coupling module, said transducer being separable from said coupling module at said transducer connector plug;
- providing said removable coupling module with a processor connector plug for connection of said memory integrated circuit to said processor, said coupling module being separable from the processor at said processor connector plug;
- storing in said memory integrated circuit information about said transducer relevant to operation of said processor;
- plugging said transducer into said transducer connector plug of the removable coupling module;
- plugging said removable coupling module into said processor at said processor connector plug;
- obtaining said information with said processor through said processor connector plug from said memory integrated circuit in said coupling module; and
- operating said processor pursuant to said obtained information to process electric current coming from or going to said transducer through said connector plugs.

12. The method as in claim 11, wherein
- said transducer is a radiant energy sensor providing an electric signal as said electric current in response to sensed radiant energy;
- said information of said radiant energy-to-electric signal value response characteristic of said sensor and is stored in said memory integrated circuit in said coupling module;

information of said radiant energy-to-electric signal response characteristic is obtained with said processor from said memory integrated circuit in said coupling module; and said processor is operated pursuant to said obtained information of said radiant energy-to-electric signal response characteristic to process said electrical signal.

13. The method as in claim 11, wherein:

said transducer is a luminous energy sensor providing an electric signal as said electric current in response to sensed luminous energy;

said information is a luminous energy-to-electric signal value response characteristic of said sensor and is stored in said memory integrated circuit in said coupling module;

information of said luminous energy-to-electric signal value response characteristic is obtained with said processor from said memory integrated circuit in said coupling module;

electric signal values produced by said sensor in response to corresponding luminous energy values are applied through said coupling module to said processor; and said processor determines said luminous energy values from said applied electric signal values with the aid of said information of said luminous energy-to-electric signal value response characteristic obtained from said memory integrated circuit in said coupling module to process said electric signal.

14. The method as in claim 11, wherein:

said transducer is a radiant energy sensor providing an electric signal as said electric current in response to sensed radiant energy;

said processor is part of an electric power mater;

said information is a radiant energy-to-electric signal value response characteristic of said sensor and is stored in said memory integrated circuit in said coupling module;

information of said radiant energy-to-electric signal value response characteristic is obtained with said processor from said memory integrated circuit in said coupling module;

electric signal values produced by said sensor in response to corresponding radiant energy values are applied through said coupling module to said processor; and said processor determines said radiant energy values from said applied electric signal values with the aid of said information of said radiant energy-to-electric signal value response characteristic obtained from said memory integrated circuit in said coupling module for display of said radiant energy values by said power meter.

15. The method as in claim 11, wherein:

said transducer is a radiant energy emitter electrically energized from said processor;

said information is an electric energization-to-radiant energy conversion characteristic of said radiant energy emitter and is stored in said memory integrated circuit in said coupling module;

information of said electric energization-to-radiant energy conversion characteristic of said radiant energy emitter is obtained with said processor from said memory integrated circuit in said coupling module; and said radiant energy emitter is electrically energized with said processor pursuant to said obtained information of said electric energization-to-radiant energy conversion characteristic.

16. The method as in claim 11, including the steps of:

providing a second electric current/radiant energy transducer;

providing a second removable coupling module for insertion between said processor and said second transducer;

providing a second memory integrated circuit in said second coupling module;

providing said second removable coupling module with a second transducer connector plug accessible externally of said second coupling module for connection of at least said second transducer to said second coupling module, said second transducer being separable from said second coupling module at said second transducer connector plug;

providing said second removable coupling module with a second processor connector plug for connection to said processor, said second coupling module being separable from the processor at said second processor connector plug;

storing in said second memory integrated circuit second information about said second transducer relevant to operation of said processor;

plugging said second transducer into said second transducer connector plug of said second coupling module;

plugging said second removable coupling module into said processor at said second processor connector plug;

obtaining said second information with said processor through said second processor connector plug from said second memory integrated circuit in said second coupling module; and operating said processor pursuant to said obtained second information to process electric current coming from or going to said second transducer through said second connector plugs.

17. The method as in claim 11, including the steps of:

providing said memory integrated circuit on a circuit board;

providing said circuit board and said memory integrated circuit with said transducer connector plug for connection to said transducer;

providing said circuit board and said memory integrated circuit with said processor connector plug for connection to said processor; and incorporating said circuit board with said memory integrated circuit and said connector plugs in said coupling module.

18. A method as in claim 17, including the step of:

providing said circuit board on a flexible substrate.

* * * * *